United States Patent
Ahn et al.

(10) Patent No.: US 9,285,409 B2
(45) Date of Patent: Mar. 15, 2016

(54) APPARATUS FOR INSPECTING STATIC ELECTRICITY OF SUBSTRATE AND METHOD OF MANUFACTURING SUBSTRATE

(71) Applicants: Jeong Hyun Ahn, Yongin (KR); Kyoung Hyo Kim, Yongin (KR)

(72) Inventors: Jeong Hyun Ahn, Yongin (KR); Kyoung Hyo Kim, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 152 days.

(21) Appl. No.: 13/946,052

(22) Filed: Jul. 19, 2013

(65) Prior Publication Data

US 2014/0139232 A1   May 22, 2014

(30) Foreign Application Priority Data

Nov. 20, 2012  (KR) .......................... 10-2012-0131798

(51) Int. Cl.
*G01R 29/12* (2006.01)
*G09G 3/00* (2006.01)

(52) U.S. Cl.
CPC ............... *G01R 29/12* (2013.01); *G09G 3/006* (2013.01); *G09G 2330/04* (2013.01)

(58) Field of Classification Search
CPC ................... G01R 29/12–29/14; G09G 3/006; G09G 3/0066
USPC ............. 324/452–470, 750.08, 76.11, 92–94; 438/11–18, 9; 204/164; 216/59
See application file for complete search history.

(56) References Cited

U.S. PATENT DOCUMENTS

| | | | |
|---|---|---|---|
| 6,232,134 B1 * | 5/2001 | Farber et al. | 438/9 |
| 6,719,142 B1 * | 4/2004 | Menear et al. | 206/711 |
| 6,741,445 B1 * | 5/2004 | Phan et al. | 361/230 |
| 7,555,950 B2 * | 7/2009 | Ruohio et al. | 73/514.32 |
| 2002/0173059 A1 * | 11/2002 | Ma | 438/17 |
| 2003/0098706 A1 * | 5/2003 | Schroeder | 324/765 |
| 2006/0249729 A1 * | 11/2006 | Mundt et al. | 257/48 |
| 2012/0212874 A1 * | 8/2012 | Fukada | 361/213 |

FOREIGN PATENT DOCUMENTS

| | | |
|---|---|---|
| JP | 2007-303961 A | 11/2007 |
| JP | 2008-096167 A | 4/2008 |
| KR | 10 2006-0005678 A | 1/2008 |

* cited by examiner

*Primary Examiner* — Melissa Koval
*Assistant Examiner* — Lee Rodak
(74) *Attorney, Agent, or Firm* — Lee & Morse, P.C.

(57) ABSTRACT

An apparatus for inspecting static electricity of a substrate includes a probe having substantially a same shape as a substrate to be inspected, the probe including a contact surface made of a conductive material, a wiring connected to the contact surface of the probe and delivering static electricity collected by the probe, and a measurement unit connected to the wiring, the measurement unit receiving the static electricity from the wiring and analyzing an intensity of the static electricity.

9 Claims, 10 Drawing Sheets

APPARATUS FOR INSPECTING STATIC ELECTRICITY OF SUBSTRATE AND METHOD OF MANUFACTURING SUBSTRATE

This application claims priority under 35 U.S.C. §119 to Korean Patent Application No. 10-2012-0131798, filed on Nov. 20, 2012 in the Korean Intellectual Property Office, the disclosure of which is incorporated herein by reference in its entirety.

BACKGROUND

1. Field

Embodiments relate to an apparatus of inspecting static electricity of a substrate and a method of manufacturing a substrate.

2. Description of the Related Art

A substrate for flat panel displays (FPDs) such as organic light-emitting displays, liquid crystal displays (LCDs), and plasma display panels (PDP) goes through many manufacturing processes before being made into a finished product.

One of the manufacturing processes may be a fluid treatment process using a gas such as a reaction gas or a liquid such as a liquid chemical. The fluid treatment process may be a substrate cleaning process, a thin film deposition process, a coating process and etc.

SUMMARY

Embodiments are directed to an apparatus for inspecting static electricity of a substrate including a probe having substantially a same shape as a substrate to be inspected, the probe including a contact surface made of a conductive material, a wiring connected to the contact surface of the probe and delivering static electricity collected by the probe, and a measurement unit connected to the wiring, the measurement unit receiving the static electricity from the wiring and analyzing an intensity of the static electricity.

The measurement unit may include a static electricity measurement unit that receives the static electricity from the probe and measures an amount of the static electricity, a memory that stores a reference static electricity value, and a comparator that compares a measured static electricity value received from the static electricity measurement unit with the reference static electricity value received from the memory.

The probe may include a plurality of sub probes that collectively have a same size as the substrate to be inspected.

The wiring may include a plurality of wirings respectively connected to the sub probes.

The apparatus may further include a control unit that controls process conditions according to the intensity of the static electricity analyzed by the measurement unit.

Embodiments are also directed to an apparatus for inspecting static electricity of a substrate including a probe including a convex surface and a concave surface, at least one of the convex surface and the concave surface being a contact surface made of a conductive material, a wiring connected to the contact surface of the probe and delivering static electricity collected by the probe, and a measurement unit connected to the wiring, the measurement unit receiving the static electricity from the wiring, and analyzing an intensity of the static electricity.

The measurement unit may include a static electricity measurement unit that receives the static electricity from the probe and that measures an amount of the static electricity, a memory that stores a reference static electricity value, and a comparator that compares a measured static electricity value received from the static electricity measurement unit with the reference static electricity value received from the memory.

The probe may include a first probe and a second probe that face each other.

The probe may be a mesh-type probe including a plurality of holes that penetrate the convex surface and the concave surface.

The probe may include a first probe, a second probe, and a third probe arranged side by side in a direction. The first probe may be a mesh-type probe including a plurality of holes that penetrate the convex surface and the concave surface. The second probe and the third probe may be located on respective sides of the first probe.

The apparatus may further include a control unit that controls process conditions according to the intensity of the static electricity analyzed by the measurement unit.

Embodiments are also directed to a method of manufacturing a substrate including providing a probe that has substantially a same shape as a substrate to be inspected, the probe including a contact surface made of a conductive material, and the probe being at a position where the substrate is placed, applying a mock treatment process to the probe, receiving static electricity collected by the contact surface of the probe in the applying of the mock treatment process and measuring an amount of the static electricity to provide a measured static electricity value, comparing the measured static electricity value with a reference static electricity value, and determining whether the measured static electricity value is greater than the reference static electricity value.

The method may further include performing a real treatment process under process conditions of the mock treatment process when the measured static electricity value is smaller than the reference static electricity value, and adjusting process conditions for the real treatment process when the measured static electricity value is greater than the reference static electricity value.

The probe may include a plurality of sub probes that collectively have a same size as the substrate and that are arranged on a stage.

The real treatment process may be a fluid treatment process in which fluid is sprayed from a fluid spray nozzle.

Embodiments are also directed to a method of manufacturing a substrate including placing a probe that includes a convex surface and a concave surface on a side of or above a substrate to be inspected, wherein at least one of the convex surface and the concave surface is a contact surface made of a conductive material, applying a mock treatment process for the substrate to the probe, receiving static electricity collected by the contact surface of the probe in the applying of the mock treatment process and measuring an amount of the static electricity to provide a measured static electricity value, comparing the measured static electricity value with a reference static electricity value, and determining whether the measured static electricity value is greater than the reference static electricity value.

The method may further include performing a real treatment process under process conditions of the mock treatment process when the measured static electricity value is smaller than the reference static electricity value and adjusting process conditions for the real treatment process when the measured static electricity value is greater than the reference static electricity value.

The probe may include a first probe and a second probe that are arranged on respective sides of the substrate to face each other.

The probe may be a mesh-type probe including a plurality of holes that penetrate the convex surface and the concave surface.

The probe may include a first probe that includes a plurality of holes penetrating the convex surface and the concave surface, and a second probe and third probe that are arranged on respective sides of the first probe.

The real treatment process may be a fluid treatment process in which fluid is sprayed from a fluid spray nozzle.

BRIEF DESCRIPTION OF THE DRAWINGS

The above and other aspects and features will become more apparent by describing in detail exemplary embodiments thereof with reference to the attached drawings, in which.

DETAILED DESCRIPTION

Advantages and features and methods of accomplishing the same may be understood more readily by reference to the following detailed description of preferred embodiments and the accompanying drawings. However, these may be embodied in many different forms and should not be construed as being limited to the embodiments set forth herein. Rather, these embodiments are provided so that this disclosure will be thorough and complete and will fully convey exemplary implementations to those skilled in the art.

It is to also be understood that when a layer is referred to as being "on" another layer or substrate, it may be directly on the other layer or substrate, or intervening layers may also be present. The same reference numbers indicate the same components throughout the specification.

It is to be understood that, although the terms first, second, third etc. may be used herein to describe various elements, components, regions, layers, and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings.

Hereinafter, embodiments will be described with reference to the accompanying drawings.

Figure 1:
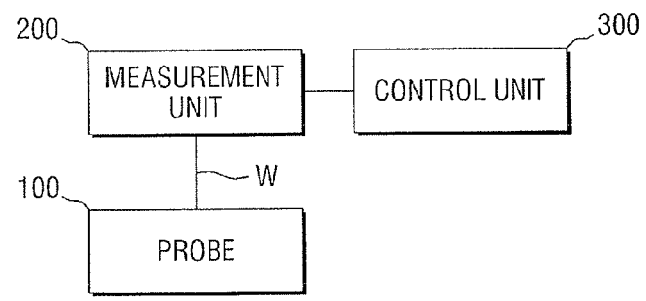
FIG. 1 is a diagram illustrating the configuration of an apparatus for inspecting static electricity of a substrate according to an embodiment.

FIG. 1 is a diagram illustrating the configuration of an apparatus 10 for inspecting static electricity of a substrate according to an embodiment.

Referring to FIG. 1, the inspection apparatus 10 may be an apparatus for inspecting static electricity generated in the process of manufacturing a substrate.

The substrate may be a substrate for displays. For example, the substrate may be a substrate for flat panel displays (FPDs) such as organic light-emitting displays, liquid crystal displays (LCDs), and plasma display panel (PDPs). The substrate may be a bare substrate or a substrate having structures such as thin films and wirings.

In addition, the substrate may be a substrate being manufactured or a manufactured substrate. The substrate may be a substrate for single displays or may be a mother substrate including a plurality of unit cells. The mother substrate may be cut into display substrates corresponding to the unit cells, respectively. Further, the substrate may be a single substrate or a stack of two or more substrates which either contact each other or are separated to face each other.

The inspection apparatus 10 may be installed as a separate apparatus or may be attached to or integrated into another substrate manufacturing apparatus. In an exemplary embodiment, the inspection apparatus 10 may be used in a fluid treatment process. For example, the inspection apparatus 10 may be used to inspect static electricity generated by a fluid treatment before, during, and/or after the fluid treatment process.

The fluid treatment process may be a process using a gas such as a reaction gas or a liquid such as a liquid chemical. Examples of the fluid treatment process may include a substrate cleaning process, a thin-film deposition process, and a coating process. In some embodiments, the fluid treatment process may be performed using a fluid spray nozzle.

The inspection apparatus 10 includes a probe 100, which senses static electricity, a wiring W, which delivers the static electricity sensed by the probe 100, and a measurement unit 200, which determines whether the intensity of the static electricity is normal by analyzing the intensity of the static electricity received from the probe 100. In some embodiments, the inspection apparatus 10 may further include a control unit 300, which adjusts process conditions based on the determination result of the measurement unit 200.

The probe 100 collects fluid that includes static electricity and senses the static electricity of the fluid. For reliable sensing of static electricity, the probe 100 may include an expanded fluid contact surface. The probe 100 will be described in detail below.

Figure 2:
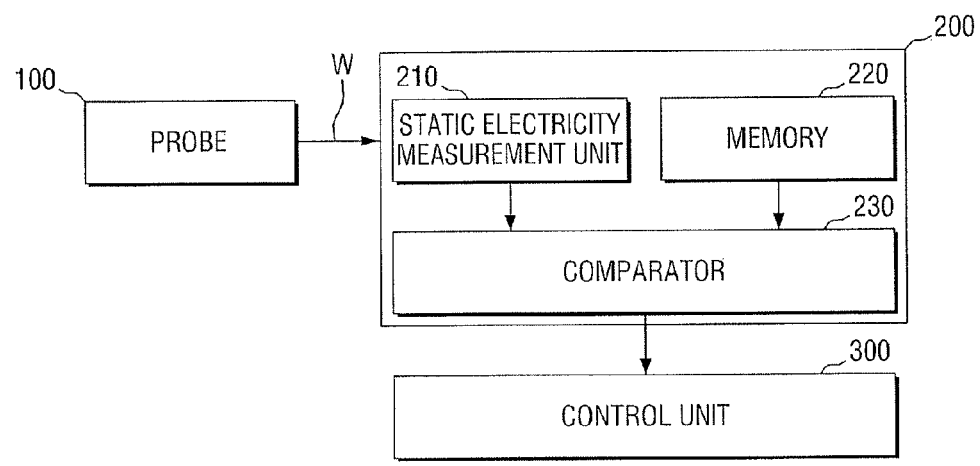
FIG. 2 is a block diagram of the substrate inspection apparatus shown in FIG. 1.

FIG. 2 is a block diagram of the substrate inspection apparatus 10 shown in FIG. 1. Referring to FIG. 2, static electricity sensed by the probe 100 is delivered to the measurement unit 200 via the wiring W. The measurement unit 200 may include a static electricity measurement unit 210, a memory 220, and a comparator 230.

The static electricity measurement unit 210 receives static electricity from the probe 100 and measures the amount of the static electricity. The static electricity may be measured by sensing a voltage or the amount of electric current. A measured value of the static electricity is sent to the comparator 230. The measured value sent to the comparator 230 may be at least one of a maximum value, a mean value, and an accumulated amount of static electricity measured for a predetermined period of time.

The memory 220 may store a reference static electricity value. The reference static electricity value may be a critical static electricity value determined to cause a defect in a process. In an exemplary embodiment, the reference static electricity value may include a plurality of different levels. For example, a first level, a second level and a third level may be stored as the reference static electricity value, and a period of time during which a process may be performed without a defect at each level of the reference static electricity value may be matched with each level. The reference static electricity value may be provided to the comparator 230.

The comparator 230 compares an input measured static electricity value with the reference static electricity value and determines whether the measured static electricity value is greater or smaller than the reference static electricity value or a certain level of the reference static electricity value based on the comparison result.

The determination result of the comparator 230 may be displayed so that a user can see it or may be sent to the controller 300.

If the comparator 230 determines that the measured static electricity value is smaller than the reference static electricity value, the controller 300 controls a process to be performed without an adjustment of process conditions. If the measured static electricity value is not smaller than the reference static electricity value, the controller 300 adjusts process conditions. The adjusting of the process conditions may include adjusting the viscosity of fluid, adjusting the amount of the fluid sprayed, adjusting the spray rate of the fluid, adjusting the spray angle of the fluid, and limiting a period of time during which a process may be continuously performed.

Hereinafter, various shapes of probes applied to the above-described inspection apparatus 10 will be described in more detail. FIGS. 3 through 8 are perspective views of probes for an apparatus for inspecting static electricity of a substrate according to various embodiments.

Figure 3:
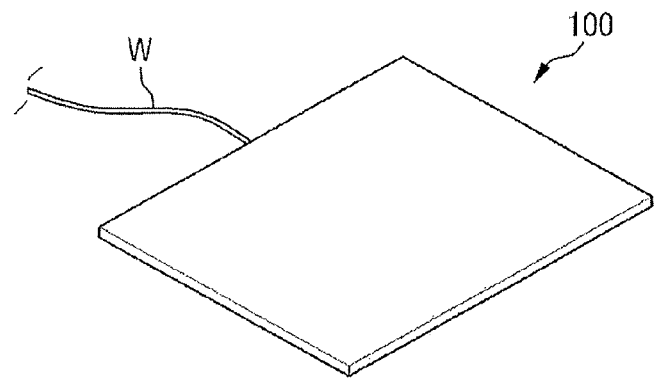
FIGS. 3 through 8 are perspective views of probes for an apparatus for inspecting static electricity of a substrate according to various embodiments.

A probe 100 shown in FIG. 3 may have substantially the same shape and size as a substrate to be inspected. The whole surface of the probe 100 is a surface that contacts fluid including static electricity and may be made of a conductive material. The fluid contact surface made of the conductive material is electrically connected to a wiring. Thus, the static electricity of collected fluid may be delivered along the wiring.

The probe 100 of FIG. 3 may be placed at the same position (e.g., on a stage or a transfer roller) as a substrate to be inspected and, in a mock treatment process, may be exposed to the same atmosphere and process conditions as a real treatment process. Then, fluid may be collected in an amount equal or equivalent to the amount of fluid that is collected in the real treatment process, and the amount of static electricity included in the fluid may be measured. In particular, since the fluid contact surface of the probe 100 has substantially the same size as the substrate to be inspected, an amount of electrified fluid equivalent to the amount of fluid that is collected on and contacts the substrate in the real treatment process may be collected. This configuration may enable a more direct and accurate static electricity inspection.

Figure 4:
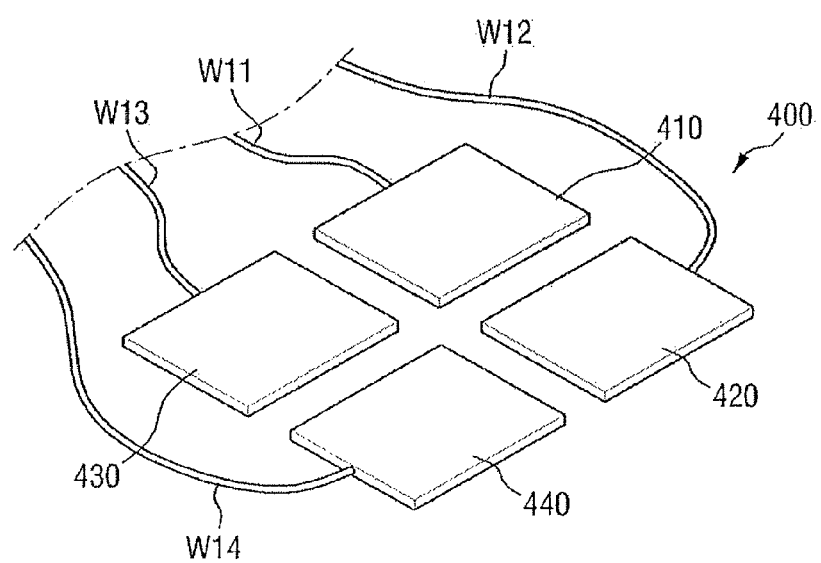

In FIG. 4, the probe 100 of FIG. 3 may be divided into a plurality of probes. That is, a probe 400 of FIG. 4 includes four sub probes 410 through 440 which are separated from each other and connected to separate wirings W11 through W14, respectively. The sub probes 410 through 440 may be arranged to be adjacent but separated from each other. An area occupied by the four sub probes 410 through 440 arranged adjacent to each other may have substantially the same shape and size as a substrate to be inspected. Each of the sub probes 410 through 440 may independently contact a fluid and sense static electricity of the fluid in a mock treatment process. Therefore, at a position where the substrate to be inspected is placed, the sub probes 410 through 440 may be able to respectively measure the amounts of static electricity in corresponding regions of the substrate. This enables more precise static electricity inspection.

Figure 5:
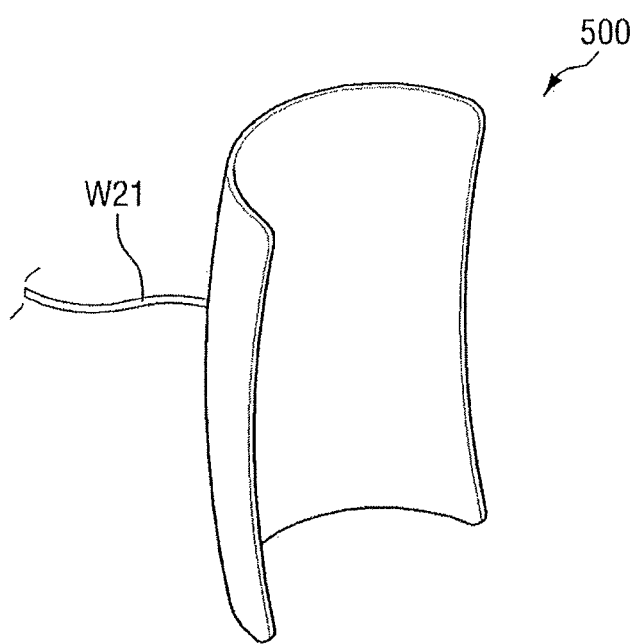
Figure 11:
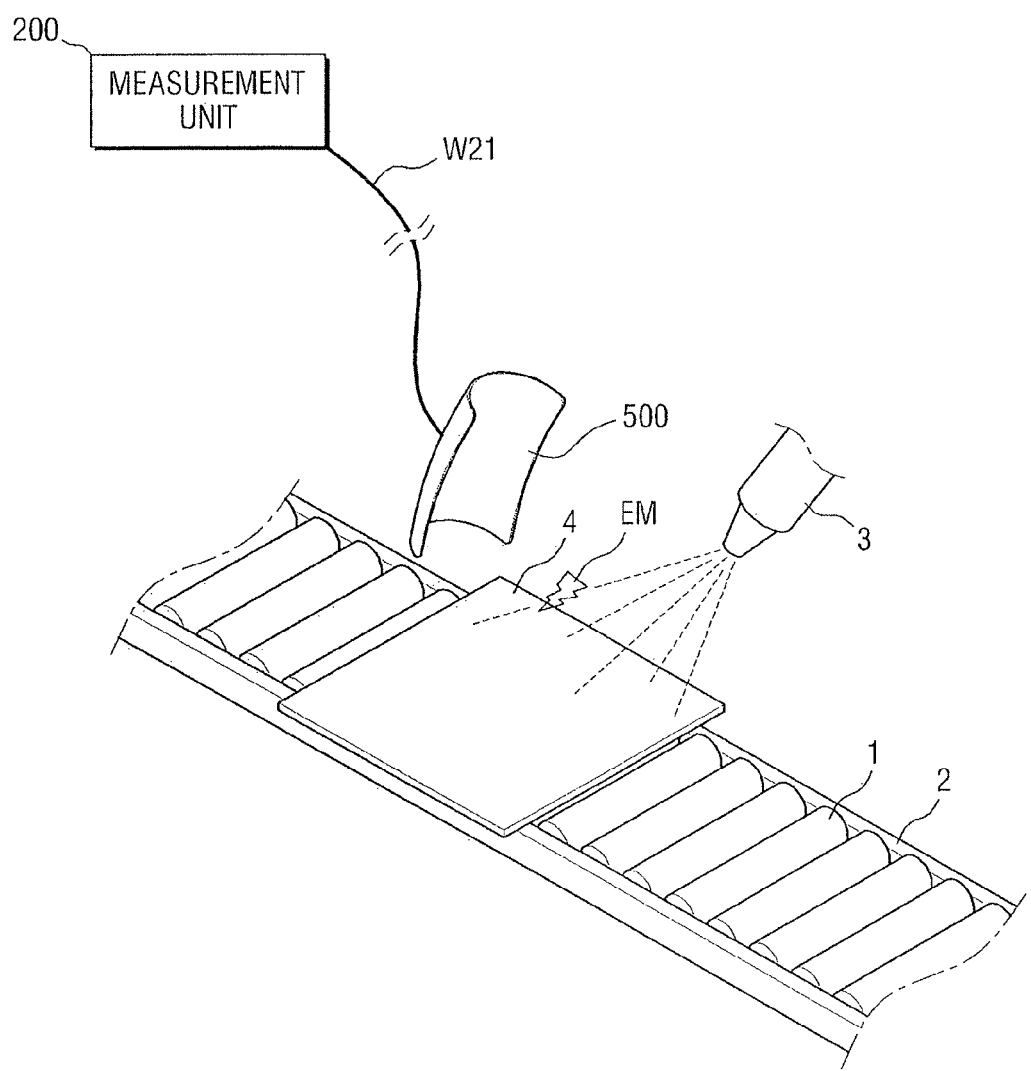
Figure 12:
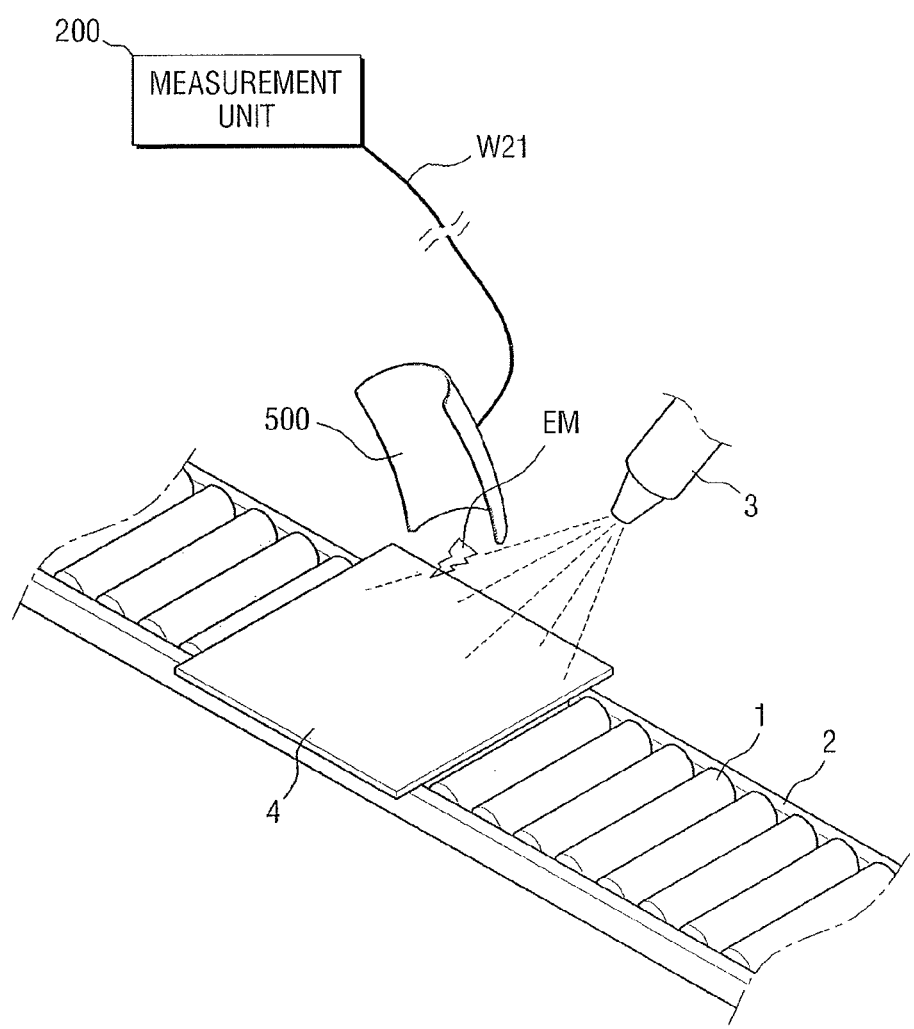

The embodiment of FIG. 5 is different from the embodiment of FIG. 3 in that a probe 500 is not flat like the probe 100 of FIG. 3 but is curved. At least one of a convex surface and a concave surface of the probe 500 serves as a fluid contact surface. The curved probe 500 may be advantageous in collecting fluid that bounces off a substrate in a real treatment process, as shown in FIGS. 11 and 12. The fluid contact surface of the probe 500 is curved and has a sufficiently large area. Accordingly, the probe 500 may be able to contact a sufficient amount of fluid. A value of static electricity measured based on the fluid collected by the probe 500 may not be able to reflect the exact amount of static electricity applied to the substrate, unlike in the embodiment of FIG. 3. Therefore, the measured value may be corrected based on a reference value or statistical data and then input to the comparator 230.

The probe 500 of FIG. 5 may be placed on a side of or above a position where a substrate to be inspected is placed in the real treatment process. A substrate used in the real treatment process may be placed at the above position, and then static electricity may be measured using the probe 500. Fluid bouncing off the substrate used in the real treatment process is collected using the probe 500 having a larger contact surface. Accordingly, static electricity inspection may be performed in an environment closer to the real treatment process. Furthermore, static electricity inspection may be performed at the same time as a fluid treatment process performed on the substrate.

Figure 6:
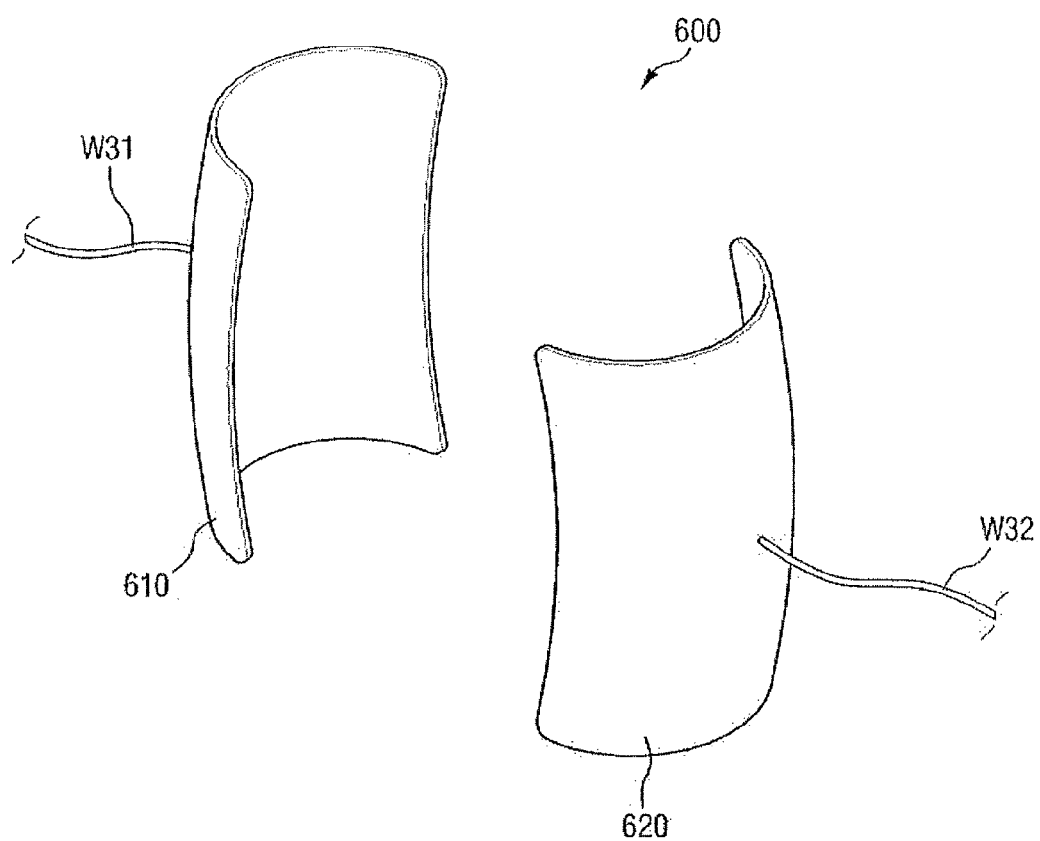

In FIG. 6, the probe 500 of FIG. 5 may be provided in a plurality. That is, a probe 600 of FIG. 6 may include a first probe 610 and a second probe 620 which are placed to face each other and are connected to separate wirings W31 and W32, respectively. The first probe 610 and the second probe 620 may be separated by a substrate to be inspected in a real treatment process. Since the first probe 610 and the second probe 620 collect fluid bouncing off the substrate at two positions, instead of at one position, the probes 610, 620 may be able to contact a sufficient amount of fluid. Therefore, static electricity may be inspected more accurately based on the fluid bouncing off the substrate. In some embodiments, the wrings W31 and 32 may be independently connected to the measurement unit 200 or may be combined and connected to the measurement unit 200.

Figure 7:
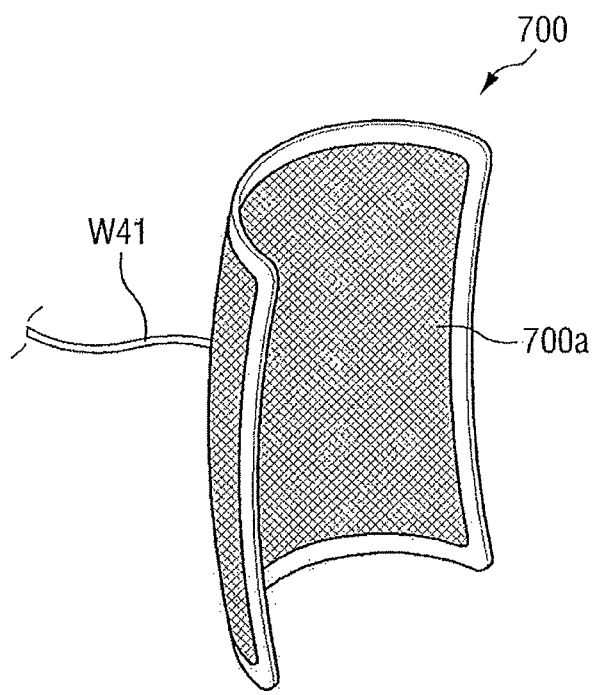

The embodiment of FIG. 7 is different from the embodiment of FIG. 5 in that a probe 700 of FIG. 7 may be a mesh type probe including a plurality of holes 700a which penetrate a convex surface and a concave surface. The embodiment of FIG. 7 may be useful in a case where the amount of fluid bouncing off a substrate is large. If fluid pressure is high, it may be difficult to fix the probe 500 of FIG. 5 at an appropriate position. However, the probe 700 of FIG. 7 may reduce the pressure applied thereto by passing some of the fluid through the holes 700a. Therefore, the probe 700 may be installed at a fixed position. Although the amount of fluid that contacts a fluid contact surface of the probe 700 is reduced, a value of static electricity measured based on the fluid collected by the probe 700 may be able to be corrected using a reference value or statistical data.

Figure 8:
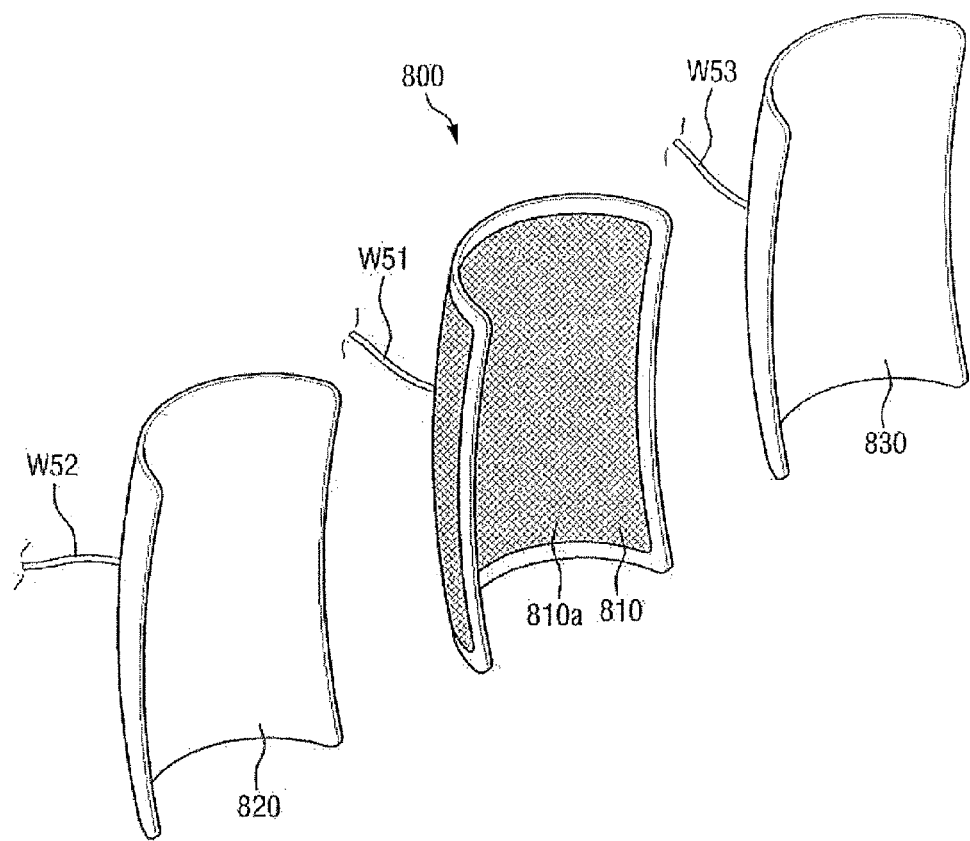

In FIG. 8, the probe 500 of FIG. 5 and the probe 700 of FIG. 7 may be arranged together. That is, a probe 800 of FIG. 8 may include a first probe 810, a second probe 820, and a third probe 830 arranged side by side in one direction. The first through third probes 810 and 830 are connected to separate wirings W51 through W53, respectively. Like the probe 700 of FIG. 7, the first probe 810 may be a mesh type probe including a plurality of holes 800a which penetrate a convex surface and a concave surface. On the other hand, each of the second probe 820 and the third probe 830 may have a continuous surface, like the probe 500 of FIG. 5. The first probe 810 passes some of fluid bouncing off a substrate through the holes 810a, thereby reducing the pressure applied to the first probe 810. The second probe 820 and the third probe 830 are respectively placed on both sides of the first probe 810 to additionally collect the fluid bouncing off the substrate. Therefore, the second probe 820 and the third probe 830 may be able to compensate for a reduction in the amount of fluid collected by the first probe 810 due to the fluid passing through the holes 810a of the first probe 810. Therefore, even if the pressure of the fluid is high, static electricity of the fluid bouncing off the substrate may be able to be inspected with increased precision.

Using the probes 100, 400, 500, 600, 700 and 800, the inspection apparatus 10 according to the embodiment may be able to accurately measure the amount of static electricity generated in the process of manufacturing a substrate for large-area FPDs.

Therefore, the inspection apparatus 10 according to the embodiment may be able to more accurately identify the effect of static electricity, which is generated by fluid in the process of manufacturing a substrate for large-area FPDs (e.g., in a fluid treatment process), on the substrate and adjust conditions for the manufacturing process appropriately.

A method of manufacturing a substrate according to an embodiment will now be described.

Figure 9:
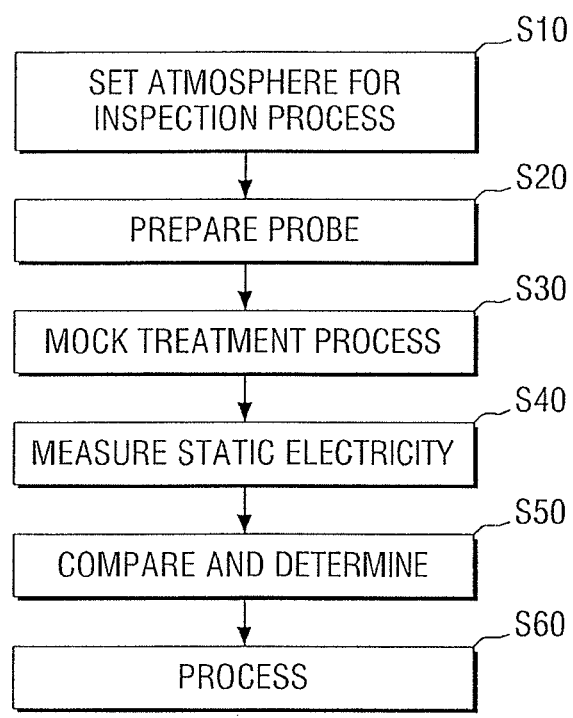
FIG. 9 is a flowchart illustrating a method of manufacturing a substrate according to an embodiment.

FIG. 9 is a flowchart illustrating a method of manufacturing a substrate according to an embodiment.

Figure 10:
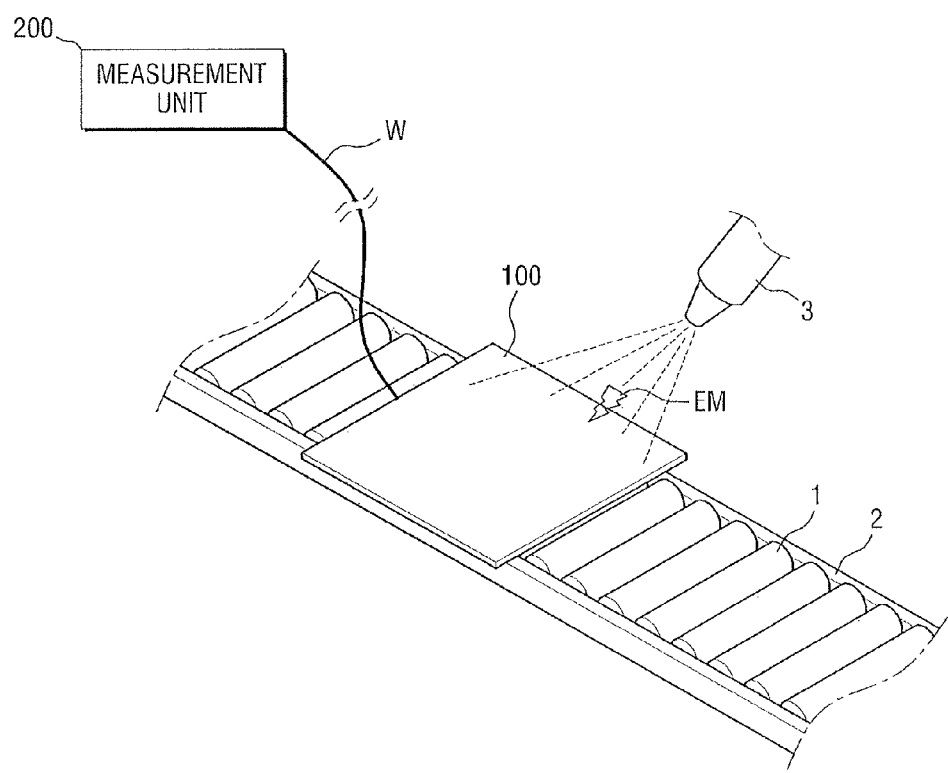
FIGS. 10 through 12 are perspective views illustrating methods of inspecting static electricity of a substrate according to various embodiments.

FIGS. 10 through 12 are perspective views illustrating methods of inspecting static electricity of a substrate according to various embodiments.

Referring to FIG. 9, the method of manufacturing a substrate according to the embodiment includes an atmosphere setting operation for an inspection process (operation S10), a probe preparation operation (operation S20), a mock treatment process (operation S30), a static electricity measurement operation (operation S40), a comparison and determination operation (operation S50), and a processing operation (operation S60).

The atmosphere setting operation for the inspection process (operation S10) is an operation of setting conditions for a real treatment process (e.g., a fluid treatment process) applied as the inspection process. The setting of the process conditions may include setting the viscosity of fluid, the spray rate of the fluid, the spray angle of the fluid, and a period of time during which a process is continuously performed. It will hereinafter be assumed that the real treatment process is a fluid treatment process.

The probe preparation operation (operation S20) is an operation of preparing a probe for sensing static electricity from a fluid to be used in the fluid treatment process for which conditions were set in the atmosphere setting operation (operation S10). The probe may be any one of the probes 100, 400, 500, 600, 700 and 800 described above with reference to FIGS. 3 through 8.

In the case of the probe 100 of FIG. 3, referring to FIG. 10, the probe 100 is placed on transfer rollers 1 installed together with a rail 2. The probe 100 is placed at the same position as a substrate to be inspected and has the same size as the substrate. Therefore, the actual amount of static electricity applied to the substrate in the fluid treatment process may be identified using the probe 100. Although not shown in the drawing, a member (e.g., a glass substrate) similar to the substrate to be inspected may be attached to a bottom surface of the probe 100 in view of static electricity between the substrate to be inspected and the transfer rollers 1. In the case of the probe 400 of FIG. 4, although not shown in the drawing, the sub probes 410 through 440 may be placed on a stage (not shown) provided on the transfer rollers 1.

In the case of the probe 500 of FIG. 5, referring to FIG. 11 or 12, the probe 500 may be placed at a position on a side of or above a substrate 4 to be inspected which is provided on transfer rollers 1. The probe 500 placed at the above position may collect fluid bouncing off the substrate 4, and the amount of static electricity applied to the substrate 4 may be identified based on the collected fluid. The position on the side of or above the substrate 4 to be inspected may be a position where a relatively large amount of fluid bounces off the substrate 4 or a position where the probe 500 may contact fluid bouncing off a wall of a space in which is the inspection process is performed from among the fluid sprayed from a fluid spray nozzle 3. Although not shown in the drawing, the probe 600 of FIG. 6, the probe 700 of FIG. 7, and the probe 800 of FIG. 8 may be placed in the same way as the probe 500 of FIG. 5.

In the mock treatment process (operation S30), a process is performed in the same atmosphere as the real treatment process. For example, referring to FIG. 10, the mock treatment process (operation S30) may include a process of spraying fluid to the probe 100 on the transfer rollers 1 from a fluid spray nozzle 3 and a process of moving the probe 100 using the transfer rollers 1. In other implementations, referring to FIGS. 11 and 12, the mock treatment process may include a process of spraying fluid to the substrate 4 stopped on the transfer rollers 1 from the fluid spray nozzle 3 and moving the substrate 4 using the transfer rollers 1.

In the static electricity measurement operation (operation S40), the amount of static electricity delivered to the probe in the mock treatment process (operation S30) is measured. For example, in the static electricity measurement operation (operation S40), the amount of static electricity delivered to the probe 100 while the fluid is being sprayed to the probe 100 stopped on the transfer rollers 1 from the fluid spray nozzle 3 in FIG. 10 may be measured, or the amount of static electricity delivered to the probe 100 while being moved by the transfer rollers 1 in a state where the fluid is not sprayed from the fluid spray nozzle 3 may be measured. The measurement of the static electricity may be performed by the static electricity measurement unit 210 included in the measurement unit 200 of FIG. 2. Referring to FIG. 10, the measurement of the static electricity may be accomplished by sensing a voltage of static electricity EM delivered to the probe 100 or the amount of electric current of the static electricity EM. In other implementations, referring to FIGS. 11 and 12, the measurement of the static electricity may be accomplished by sensing a voltage of static electricity EM delivered to the probe 500 or the amount of electric current of the static electricity EM.

The comparison and determination operation (operation S50) is an operation of comparing a measured static electricity value obtained in the static electricity measurement operation (operation S40) with a reference static electricity value and determining whether the measured static electricity value is greater or smaller than the reference static electricity value or a certain level of the reference static electricity value. The comparison and determination operation (operation S50) may be performed by the comparator 230 included in the measurement unit 200 of FIG. 2.

The processing operation (operation S60) is an operation of controlling a process to be performed without adjusting process conditions or adjusting process conditions based on the result of the comparison and determination operation (operation S50). Specifically, if the comparator 230 determines that the measured static electricity value is smaller than the reference static electricity value, the real treatment process may be determined to be performed without adjusting process conditions in the processing operation (operation S60). If the comparator 230 determines that the measured static electricity value is greater than the reference static electricity value, the conditions for the real treatment process may be adjusted. The adjusting of the process conditions may include adjusting the viscosity of fluid, adjusting the amount of the fluid sprayed, adjusting the spray rate of the fluid, adjusting the spray angle of the fluid, and limiting a period of time during which a process is continuously performed. The processing operation (operation S60) may be performed by a user after the user checks the determination result of the comparator 230 or may be performed by the control unit 300 of FIG. 2 after the control unit 300 receives the determination result of the comparator 230.

By way of summation and review, the substrate for a flat panel display (FPD) may be affected by static electricity generated by a fluid (e.g., deionized water) used in the fluid treatment process or generated by a surrounding environment. If the effect of the static electricity on the substrate is great, there may be a problem with the operation of the finished product.

Therefore, it is desirable to measure the static electricity of the substrate for a flat panel display during the manufacturing process and adjust process conditions to reduce the static electricity that may greatly affect the substrate.

Embodiments may provide at least one of the following advantages.

In an apparatus for inspecting static electricity of a substrate and a method of manufacturing a substrate according to an embodiment, the amount of static electricity generated in the process of manufacturing a substrate for large-area FPDs may be measured accurately using a probe having a large contact area.

In the apparatus for inspecting static electricity of a substrate and the method of manufacturing a substrate according to the embodiment, the effect that static electricity generated in the process of manufacturing a substrate for large-area FPDs has on the substrate may be identified more accurately, and conditions for the manufacturing process may be adjusted appropriately based on the identified effect.

However, the effects are not restricted to the one set forth herein. The above and other effects will become more apparent to one of ordinary skill in the art to which the embodiments pertain by referencing the claims.

In concluding the detailed description, those skilled in the art will appreciate that many variations and modifications can be made to the preferred embodiments without substantially departing from the principles thereof. Therefore, the disclosed preferred embodiments are used in a generic and descriptive sense only and not for purposes of limitation.

What is claimed is:

1. A method of manufacturing a substrate, the method comprising:
providing a probe having a sensing surface area that has substantially a same size as a substrate to be inspected, the probe including a contact surface made of a conductive material electrically connected through wiring to a measurement unit;
applying a mock treatment process to the probe, the mock treatment being applied in the absence of the substrate and the probe being located at a position where the substrate is placed during a real treatment process;
receiving, through the wiring, static electricity collected by the contact surface of the probe in the applying of the mock treatment process and measuring, with the measurement unit, an amount of the static electricity to provide a measured static electricity value;
comparing the measured static electricity value with a reference static electricity value;
determining whether the measured static electricity value is greater than the reference static electricity value; and
performing a real treatment process on the substrate under process conditions of the mock treatment process when the measured static electricity value is smaller than the reference static electricity value and adjusting process conditions for the real treatment process when the measured static electricity value is greater than the reference static electricity value.

2. The method of claim 1, wherein the probe includes a plurality of sub probes having sensing surfaces areas that collectively have substantially the same size as the substrate and that are arranged on a stage.

3. The method of claim 1, wherein the real treatment process is a fluid treatment process in which fluid is sprayed from a fluid spray nozzle.

4. The method of claim 1, wherein:
the mock treatment involves applying a process fluid,
the amount of the static electricity is measured in to the process fluid.

5. A method of manufacturing a substrate, the method comprising:
placing a probe that includes a convex surface and a concave surface on a side of or above a substrate to be inspected, wherein at least one of the convex surface and the concave surface is a contact surface made of a conductive material electrically connected through wiring to a measurement unit;
applying a mock treatment process to the substrate, wherein the mock treatment process includes applying a fluid to a surface of the substrate, the probe being located such that fluid that bounces off the substrate is collected by the probe;
measuring, with the measurement unit, an amount of static electricity included in the fluid collected by the probe and received through the wiring to provide a measured static electricity value;
comparing the measured static electricity value with a reference static electricity value;
determining whether the measured static electricity value is greater than the reference static electricity value; and
performing a real treatment process under process conditions of the mock treatment process when the measured static electricity value is smaller than the reference static electricity value, and adjusting process conditions for the real treatment process when the measured static electricity value is greater than the reference static electricity value.

6. The method of claim 5, wherein the probe includes a first probe and a second probe that are arranged on respective sides of the substrate to face each other.

7. The method of claim 5, wherein the probe is a mesh-type probe including a plurality of holes that penetrate the convex surface and the concave surface.

8. The method of claim 5, wherein the probe includes a first probe that includes a plurality of holes penetrating the convex surface and the concave surface, and a second probe and third probe that are arranged on respective sides of the first probe.

9. The method of claim 5, wherein the treatment process is a fluid treatment process in which the fluid is sprayed from a fluid spray nozzle.

\* \* \* \* \*